US009451697B2

(12) United States Patent
Harkness, Jr. et al.

(10) Patent No.: US 9,451,697 B2
(45) Date of Patent: Sep. 20, 2016

(54) HIGH SPEED PRINTED CIRCUIT BOARD WITH UNIFORM VIA INSIDE DIAMETER

(71) Applicants: Arthur E. Harkness, Jr., Milford, NH (US); Ralph L. Samson, Wilton, NH (US); Donald R. Reed, Nashua, NH (US)

(72) Inventors: Arthur E. Harkness, Jr., Milford, NH (US); Ralph L. Samson, Wilton, NH (US); Donald R. Reed, Nashua, NH (US)

(73) Assignee: Amphenol Corporation, Wallingford Center, CT (US)

( * ) Notice: Subject to any disclaimer, the term of this patent is extended or adjusted under 35 U.S.C. 154(b) by 0 days.

(21) Appl. No.: 14/196,642

(22) Filed: Mar. 4, 2014

(65) Prior Publication Data
US 2014/0251675 A1    Sep. 11, 2014

Related U.S. Application Data

(60) Provisional application No. 61/773,120, filed on Mar. 5, 2013.

(51) Int. Cl.
| | |
|---|---|
| *H05K 1/11* | (2006.01) |
| *H05K 1/02* | (2006.01) |
| *H05K 3/00* | (2006.01) |
| H05K 3/30 | (2006.01) |
| H05K 3/42 | (2006.01) |

(52) U.S. Cl.
CPC ............. *H05K 1/115* (2013.01); *H05K 1/025* (2013.01); *H05K 3/0044* (2013.01); *H05K 3/0047* (2013.01); *H05K 3/308* (2013.01); *H05K 3/429* (2013.01); *H05K 2201/09827* (2013.01); *H05K 2201/09854* (2013.01); *H05K 2201/1059* (2013.01); *H05K 2203/0195* (2013.01); *Y10T 29/49165* (2015.01)

(58) Field of Classification Search
CPC .. H05K 1/115; H05K 3/4038; H05K 3/0044; H05K 3/0047; H05K 3/308; H05K 2201/09827; H05K 2201/09854; H05K 2201/1059; H05K 2203/0195; H05K 3/429; H05K 1/025; H05K 1/11; H05K 2201/09845; Y10T 29/49165
USPC ................ 174/250–268; 361/760, 792–795; 439/65
See application file for complete search history.

(56) References Cited

U.S. PATENT DOCUMENTS

| | | | | |
|---|---|---|---|---|
| 4,706,167 | A | * | 11/1987 | Sullivan ........................ 361/774 |
| 5,073,119 | A | * | 12/1991 | Soes ................................ 439/82 |
| 2002/0195271 | A1 | * | 12/2002 | Gailus ........................... 174/262 |

(Continued)

FOREIGN PATENT DOCUMENTS

| | | |
|---|---|---|
| JP | 05-226423 | 9/1993 |
| JP | 05-252678 | 9/1993 |

(Continued)

OTHER PUBLICATIONS

International Search Report and Written Opinion dated Jun. 20, 2014 from corresponding Application No. PCT/US2014/020220.

*Primary Examiner* — Ishwarbhai B Patel
(74) *Attorney, Agent, or Firm* — Wolf, Greenfield & Sacks, P.C.

(57) ABSTRACT

A printed circuit board, and method of manufacture, for high speed signals. The printed circuit board has small diameter vias of uniform inside diameter when plated. The uniformity of the inside diameter, at least over the region in which a press fit segment is inserted, is sufficient to make a reliable electrical and mechanical connection to the press fit segment with reduced risk of damage to the press fit segment.

15 Claims, 4 Drawing Sheets

(56) References Cited

U.S. PATENT DOCUMENTS

2008/0078570 A1* 4/2008 Japp et al. .................... 174/256
2013/0123705 A1* 5/2013 Holm et al. .................. 604/171
2013/0213705 A1* 8/2013 Suehiro et al. ............... 174/262

FOREIGN PATENT DOCUMENTS

| JP | 2003-115658 | 4/2003 |
| JP | 2010-040469 | 2/2010 |
| JP | 2010-251402 | 11/2010 |

* cited by examiner

HIGH SPEED PRINTED CIRCUIT BOARD WITH UNIFORM VIA INSIDE DIAMETER

RELATED APPLICATION

The present application claims the benefit of U.S. Provisional Application Ser. No. 61/773,120, filed Mar. 5, 2013, which is hereby incorporated by reference herein in its entirety.

FIELD OF THE INVENTION

The invention relates to a printed circuit board and methods of manufacture.

BACKGROUND

Printed circuit boards (PCBs) are widely used in the electronics industry for assembling electronic assemblies. PCBs may be manufactured from stacks of dielectric sheets, sometimes called "prepreg," some or all of which may have a conductive film on one or both surfaces. Some of the conductive films may be patterned, using lithographic techniques, to form conducting traces that are used to make interconnections within circuits that may contain a variety of circuit elements, e.g., resistors, capacitors, inductors, transistors, fuses, integrated circuits (ICs), trim pots, electro-acoustic devices, microelectromechanicanical devices (MEMs), electro-optical devices, microprocessing chips, memory chips, multi-pin connectors, and various types of sensors, etc. Others of the conductive films may be left substantially intact and may act as ground or power "planes." These dielectric sheets may be formed into an integral "board" structure such as by pressing the stacked up sheets under pressure.

To make electrical connections to the traces or ground/power planes holes may be drilled through the board. These holes, or "vias," are filled or plated with metal such that a via will be electrically connected to any of the interior conductive traces or planes through which it passes.

To attach components to the PCB, "tails" from the components may be inserted into the vias, with or without using solder. Alternatively, solder pads may be formed on a surface of the board connecting to a via, and a tail of a component may be soldered to such a pad. As a result, electrical traces and vias may be formed within a PCB.

SUMMARY

This application is directed towards a high-frequency printed circuit board and methods for making such a printed circuit board.

The inventors have developed a method of manufacturing a printed circuit board to support high-frequency signals. Such a printed circuit board may accommodate press fit attachment technology for components, such as electrical connectors, mounted to the printed circuit board. In accordance with some embodiments, the printed circuit board may have small diameter vias, which support the use of small compliant sections on components mounted to the printed circuit board. The small compliant sections may provide desirable impedance properties at the interface between the printed circuit board and the attached components. These desirable impedance properties may support high-frequency signals without reflections, mode conversions or other distortion that can limit the operating range of the overall electronic system including the connector in printed circuit board.

Small diameter vias may have an un-plated internal diameter that is contoured. The contour may provide for a decreasing diameter starting at a surface through which a compliant member is inserted. The contour may compensate for differential plating rates as a function of the depth below the surface of the via. Following plating, the larger diameter portions of the un-plated via may have a thicker plating, yielding a substantially uniform internal diameter of the plated via in the regions into which a compliant section is inserted.

Also contemplated by the inventors are methods for manufacturing such a printed circuit board. The methods may include drilling at least a portion of the via with a contoured bit or other tool to create a contoured, un-plated internal diameter. The via may then be plated and a compliant member may be inserted into the via.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the invention may be shown exaggerated or enlarged to facilitate an understanding of the invention. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

DETAILED DESCRIPTION

Figure 1:
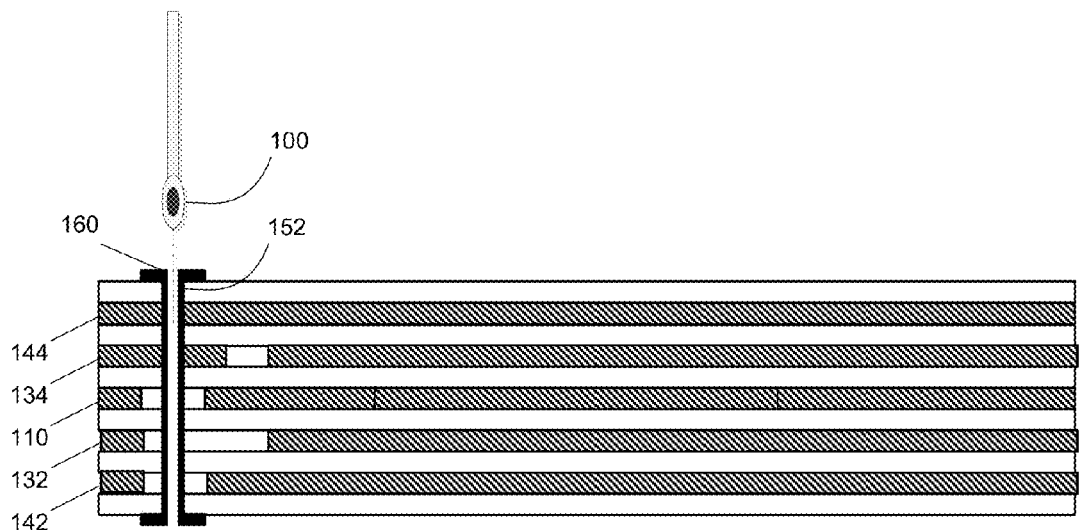
FIG. 1 depicts in cross-section a via of a printed circuit board.

The inventors have recognized and appreciated that performance of electronic systems may be achieved by providing small diameter vias in printed circuit boards of uniform plated, internal diameter. Performance of electronic systems may be limited by impedance discontinuities in the signal launch portions of printed circuit boards, which are widely used in the manufacture of electronic systems to electrically and mechanically attach components to the printed circuit board. For example, electrical connectors may have numerous contact details, each of which has a press fit section, which is inserted into a corresponding via in a printed circuit board.

Impedance discontinuities may be ameliorated by using smaller pressfit sections. However, the smaller pressfit sections are mechanically weaker and therefore subject to damage. If the compliant section of a component is damaged upon insertion into a printed circuit board, a reliable electrical connection may not be formed between that component and traces within the printed circuit board. Unreliable connections may pass initial testing but may create problems during operation of an electronic device. Even if damage to the small press fit section is identified upon manufacture, the cost of repairing the damage is undesirable The inventors have recognized and appreciated that differential rates of plating as a function of depth of the via below the surface of the printed circuit board leads to plated vias of nonuniform inside diameter. In order to ensure reliable electrical connection, the plating in the deeper sections of the via, where plating occurs at a slower rate, may be made to a nominal thickness. However the plating in sections of the via closer to the surface, or plating occurs at a faster rate, will be thicker, potentially making the inside diameter of the plated hole so small that a compliant section does not fit reliably within the via and may be damaged upon insertion.

Differential plating rates may be most pronounced for small diameter vias in thick printed circuit boards, such as may be used in the manufacture of backplanes for electronic systems, such as switches, routers and large high-performance computer. In some embodiments, techniques as described herein may be used with printed circuit boards having aspect ratios greater than 15:1. In some embodiments, techniques as described herein may be used with a finished hole size less than 0.022 inches. The hole size for example may be 10-15 mils.

Use of small press fit sections may be enabled through the use of vias that better accommodate the small pressfit sections without damage. In some embodiments, the vias are made from holes that have a contour to their internal diameter prior to plating. The contour may be selected such that, after plating, the internal diameter is relatively uniform. The inside diameter of the plated via may vary +/−2 mils or less. In some embodiments, the variation in internal diameter may be +/−1.5 mils or less. In yet other embodiments, it may be +/−1 mils or less.

FIG. 1 illustrates in cross section a printed circuit board with a via 152. Via 152 is designed to receive a press fit section 100. As shown, the printed circuit board includes multiple layers, of which layers 144, 134, 110, 132 and 142 are numbered. In this example, such a printed circuit board may be made using conventional printed circuit board manufacturing techniques in which alternating layers of metal, which may be patterned with conductive traces, and insulative material are pressed into a board. That board may be drilled and the inside diameter of the hole may be plated to form a via. In this example, a plating 160 is shown. Plating 160 connects metal layers 134 and 144 and also provides connection to press fit section 100.

It should be appreciated that though a single via and single press fit section are shown in FIG. 1, in an electronic system there may be multiple such vias and multiple press fit sections. Also, the compliant section may represent a compliant section of a connector. However, the invention is not limited in this way. Accordingly, any suitable number of vias may be used and the press fit sections may form a part of any suitable component.

Figure 2:
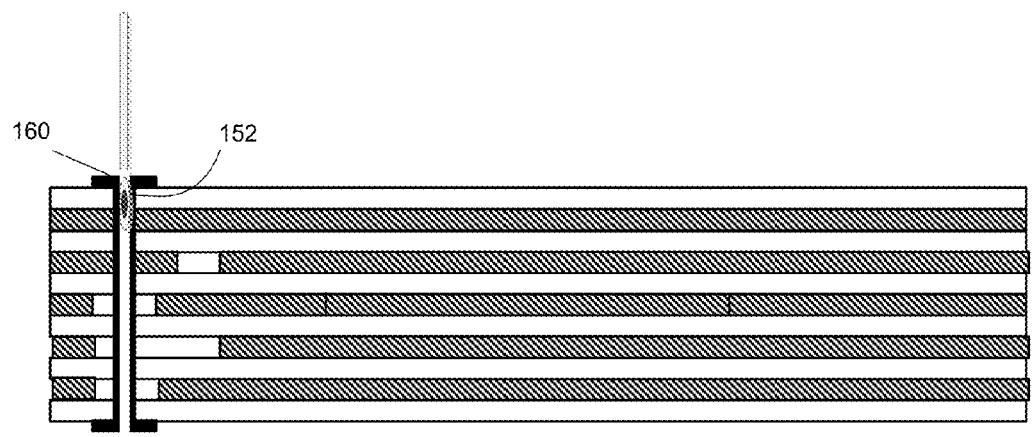
FIG. 2 depicts in cross-section the via of FIG. 1 with a contact tail inserted.

To install a component of which press fit 100 is a part, the press fit may be inserted into via 152. In this example, press fit 100 is formed with a hole in its interior portion, which can be compressed as it is inserted into a via of an appropriate size. FIG. 2 illustrates press fit 100 inserted into via 152. Compression of press fit 100 creates a spring force against the inside wall of via 152, creating a reliable electrical and mechanical connection.

However, such a reliable connection requires that the size of the hole match the size of the press fit. If the hole diameter is too small, the press fit section may be damaged. If the hole diameter is too large, reliable connection may not be formed. Moreover, this size preferably is maintained over the entire portion of the via through which compliant portion is inserted.

Conventional manufacturing processes may maintain a tolerance for the plating thickness to provide a variation more than +/−2 mils. Though, for small diameter vias, and press fit sections with a corresponding small size, tighter tolerances of +/−2 mils or less may be required.

In some embodiments, vias with a desired small size and uniform plated diameter may be made according to a method using a larger drilled hole size for a limited distance from the surface. In some embodiments, a modified drill bit may be used to increase the diameter of a hole at the surface by an amount that will fully or partially offset the normal reduction in plated hole size that occurs at the "knee" of the hole, which may be at an interior portion of the hole away from the surface. In some embodiments, the angle and length of the taper produces a gradual hole size change that does not result in a shelf or jog in the drilled hole.

In some embodiments, such a drill bit may be used to shape the top portion of an tinplated via after it is drilled with a convention drill bit. Though, it should be appreciated that the same contour to the inside diameter of the hole may be created with a single bit.

In some embodiments, the minimum diameter of the tool is 0.0005" to 0.002" less than the nominal hole size to insure a smooth transition as the taper is formed. In some embodiments, this taper may be at a relatively shallow angle, such as less than 20 degrees. In some embodiments, the taper may be less than 15 degrees. For example, the taper may be at an angle between 3 degrees and 15 degrees or between about 5 degrees and about 10 degrees. As a specific example the taper may be about 6 degrees.

The resulting tapered hole may have a smooth surface that will not introduce plating folds or sharp bends in plating. In some embodiments, maximum hole size may be controlled by both the maximum diameter of the tool, and a controlled depth set point used for the drilling operation.

Regardless of the manner of the specific tool used to form a contoured inside diameter of the unplated via, after the via is drilled, it may be plated using a conventional plating process with parameters selected to provide a uniform inside diameter, meaning an inside diameter with variation within tolerance, over at least the upper region of the via into which the press fit section is to be inserted.

Figure 3:
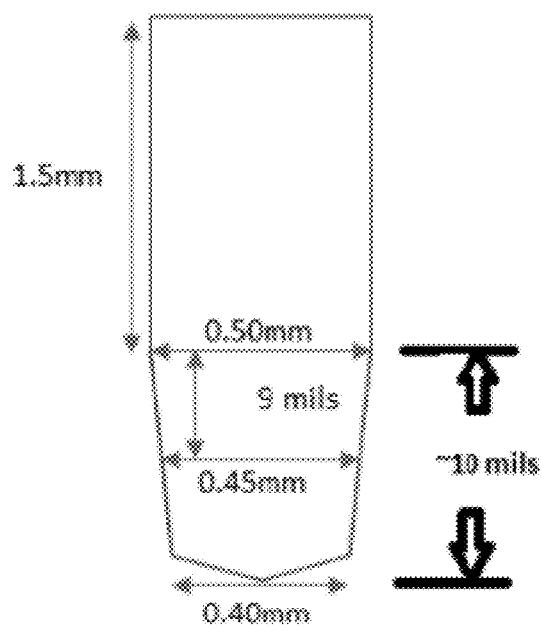
FIG. 3 depicts an exemplary embodiment of a drill that may be used to form a contoured via in accordance with some embodiments.

FIG. 3 illustrates a tool that may be used to provide the tapered section in accordance with some embodiments. Here, the tool has a tapered section over a length of approximately 10 mils. The tapered section has a maximum diameter of 0.50 mm and tapers down to a diameter of approximately 0.4 mils. This taper may be at a constant angle. Though, in some embodiments, the angle need not be constant and may be selected to lead to a uniform inside diameter of a plated via. In the illustrated embodiment, for example, the tool tapers from about 0.5 mm to about 0.45 mm over about a 9 mil length. The angle of taper may be steeper near the tip, leading to a steeper taper deeper into the hole. In this embodiment, the angle of taper is steeper at the tip to provide a change in diameter of an additional 0.05 mm over approximately 1 mil. Though, it should be appreciated that any suitable angle of taper, over any suitable length of the tool may be used.

In the embodiment illustrated, the tool has an un-tapered shaft. The shaft may be used to hold the tool. Alternatively or additionally, the un-tapered shaft may allow the tapered portion of the tool to enter the via such that the tapered portion of the via need not begin at the surface of the printed circuit board. For example, FIG. 3 shows an un-tapered shaft of 1.5 mm. If the tool is plunged this full depth into the via, the tapered portion may begin approximately 1.5 mm below the surface of the printed circuit board.

However, it should be appreciated that any suitable tool may be used. As a specific example, the tool may have a maximum diameter that is 0.0005 " to 0.003" larger than the nominal hole size for the connector. In some embodiments, the via may be initially drilled with a conventional bit designed to yield this nominal hole size. The hole may be drilled before or after drilling with a tool as described. In some embodiments, the minimum size for the tool may be 0.002" less than the nominal hole size. (possible range 0.0005" to 0.004").

The taper feature on the tool may be any suitable length. However, as a specific example, it may be 0.020". The dimensions of the tool may create any suitable taper, but as a specific example, the length of taper, plus minimum diameter and maximum diameter, may be selected to result in a 6 degree point angle. However, any of these factors: 1) minimum diameter, 2) maximum diameter, or 3) length of taper; may be adjusted to result in a different point angle. Possible range of point angle may be between 1 degree and 10 degrees.

Figure 4:
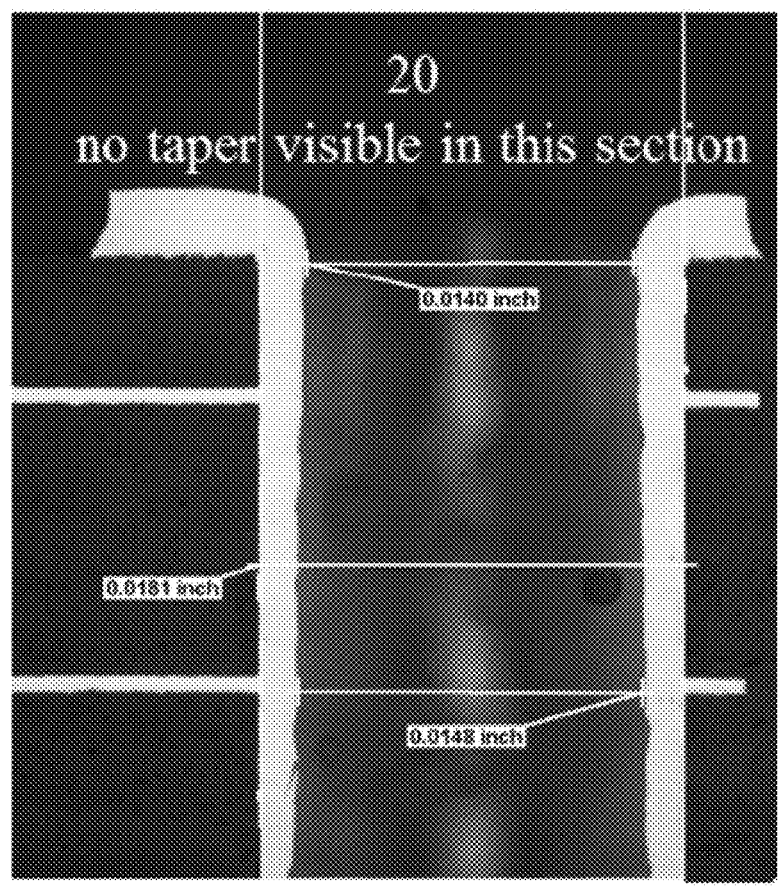
FIG. 4 is a cross-section of an exemplary embodiment of a contoured via after plating.

FIG. 4 illustrates in cross section a via formed from a contoured un-plated hole. FIG. 4 shows, following plating, a relatively uniform inside diameter for the via. For example, though the plating is thinner deeper into the hole, the taper of the un-plated hole offsets the difference in plating thickness such that the inside diameter is 0.0148 inches at the end of the tapered section and 0.0140 at the surface of the printed circuit board. Thus, the difference is less than 1 mil.

Figure 5:
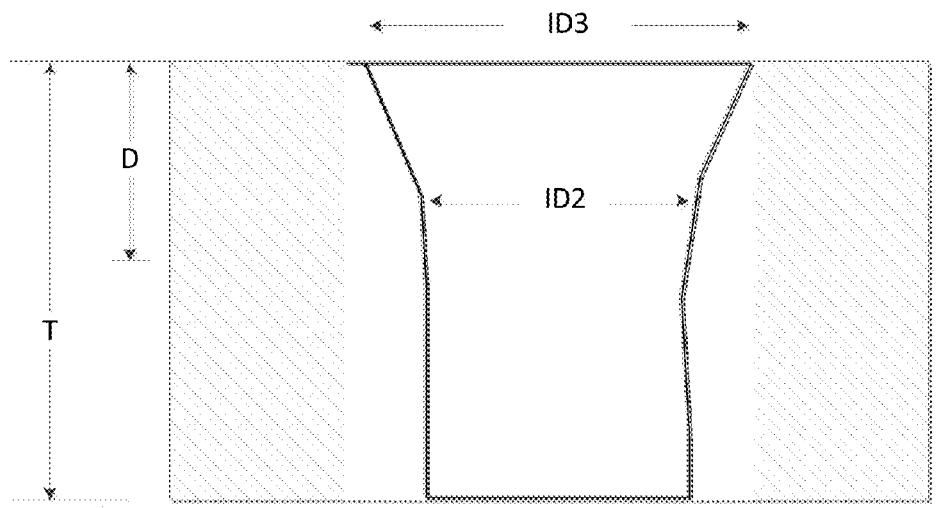
FIG. 5 is a cross-section of an exemplary embodiment of a contoured via prior to plating.

FIG. 5 provides a further example. In this example, a printed circuit board has a thickness T. The thickness may be greater than 0.25 inches. For example the printed circuit board may have more than 20 layers, such as between 20 and 40 layers.

The printed circuit board may be formed with vias to accommodate small diameter press fit section. Accordingly, the board may be manufactured with unplated vias, a representative one of which is shown in FIG. 5, with tapered regions formed over a depth, D. The depth D need not be the same for all of the vias, but, in some embodiments, may be selected to equal or exceed the depth to which the press fit section may be inserted, and may be, for example between about 5 mils and 25 mils, in some embodiments.

Accordingly, a the depth D, the un-plated via may have a diameter of ID2. ID2 may correspond to the nominal diameter of a conventional small diameter via. At the surface, though, the via may have a diameter of ID3, which may be greater than ID2. The dimensions of ID1 and ID2 may be any suitable dimensions, including those as described above.

Figure 6:
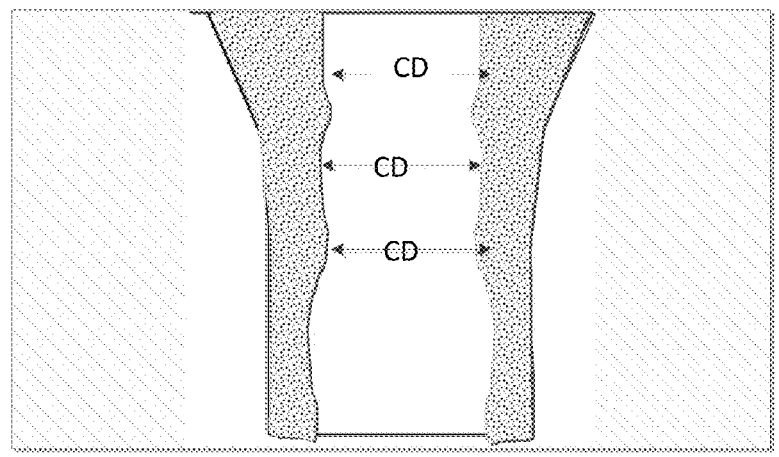
FIGS. 6 is a cross-section of the contoured via of the FIG. 5 after plating.

FIG. 6 illustrates the via of FIG. 5 after plating. As can be seen the plating varies in thickness. However the diameter of the un-plated via varies inversely in relation to the variation of the plating thickness such that the inside diameter of the plated via, at least to the depth D, is approximately CD. CD may correspond to the desired inside via diameter for a small press fit section, and may have any suitable dimensions, including dimensions as described above.

Figure 7:
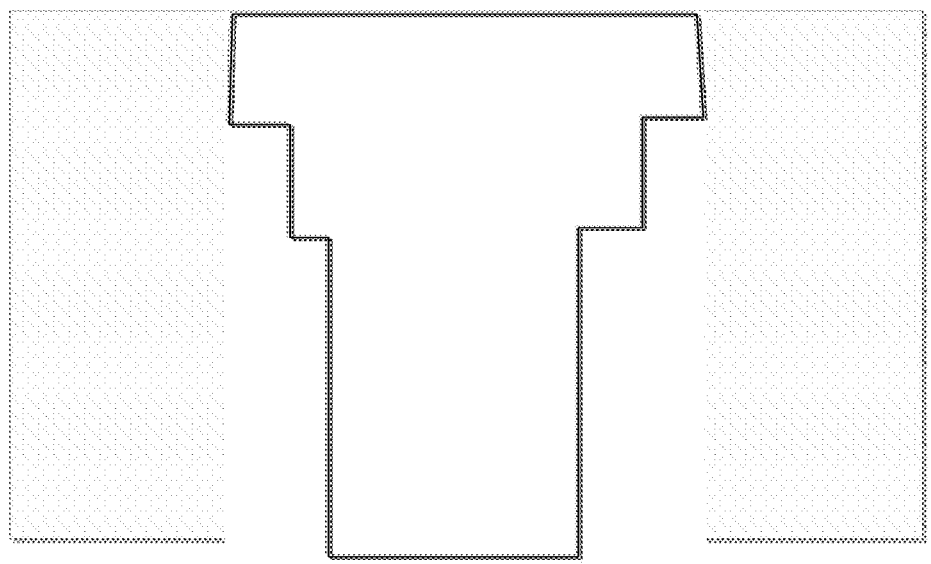
FIG. 7 is a cross-section of an alternative embodiment of a contoured via prior to plating, The features and advantages of the present invention will become more apparent from the detailed description set forth below when taken in conjunction with the drawings.

It should be appreciated that the specific shape and size of a via is not critical to the invention. FIG. 7 illustrates an example of a variation. Here the contour of the un-plated via is not smooth. Rather, a contour of increasing diameter closer to the surface may be created in discrete steps as shown. The steps may be created by a single tool, with multiple segments of different diameters. Alternatively, or additionally, the steps may be created using different tools, each with a different diameter or contour.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

The claims should not be read as limited to the described order or elements unless stated to that effect. It should be understood that various changes in form and detail may be made by one of ordinary skill in the art without departing from the spirit and scope of the appended claims. Moreover, features described in connection with one embodiment may be used in other embodiments, in combination with or in place of features described in such other embodiment. All embodiments that come within the spirit and scope of the following claims and equivalents thereto are claimed.

What is claimed is:

1. A printed circuit board comprising:
   a plurality of first layers having patterned conductive traces;
   a plurality of second insulating layers separating the plurality of first layers, wherein the first layers and second layers are bonded together in a stack; and
   a plated via extending into the stack having a length-to-diameter ratio of at least 15:1 and having a substantially uniform internal diameter along a length of the plated via and at an end of the plated via that is adapted to receive a press fit segment, wherein the plated via comprises a tapered hole formed in the stack having an un-plated inside diameter that decreases with depth into the stack and further comprises a conductive plating on the wall of the tapered hole having a plating thickness that decreases with depth into the stack.

2. The printed circuit board of claim 1, wherein the plating thickness decreases with depth in proportion to the decrease in un-plated inside diameter of the tapered hole to provide a plated inside diameter that varies over an entrance region to the plated via by less than +/−2 mils.

3. The printed circuit board of claim 2, wherein the plated inside diameter is between 10 and 15 mils.

4. The printed circuit board of claim 3, wherein plated inside diameter varies over the entrance region by less than +/−1 mil.

5. The printed circuit board of claim 1, wherein the tapered hole has a wall taper of 1 to 10 degrees over the region.

6. The printed circuit board of claim 1, wherein the tapered hole has two taper angles.

7. The printed circuit board of claim 6, wherein the printed circuit board is greater than 20 layers.

8. A printed circuit board comprising:
a plurality of first layers having patterned conductive traces;
a plurality of second insulating layers separating the plurality of first layers, wherein the first layers and second layers are bonded together in a stack;
a surface of the stack;
a plated via extending through the surface and into the stack, the plated via having a length-to-diameter ratio of at least 15:1, wherein the plated via comprises a region formed in the stack, wherein the region comprises a tapered hole with an un-plated inside diameter that decreases with depth and further comprises a conductive plating on the wall of the tapered hole having a plating thickness that decreases with depth into the stack, whereby an internal diameter of the plated via is substantially uniform over the region; and
a press fit segment positioned within the region of the plated via.

9. The printed circuit board of claim 8, wherein:
the internal diameter at the surface varies by less than ±2 mils over the length of the region.

10. The printed circuit board of claim 9, wherein:
the finished hole size of the plated via is less than 0.022 inches.

11. The printed circuit board of claim 9, wherein:
the finished hole size of the plated via is between 10 and 15 mils.

12. The printed circuit board of claim 11, wherein:
the finished hole size of the plated via varies by less than 1 mil over the region.

13. The printed circuit board of claim 11, wherein:
the region has a length of 10 mils.

14. The printed circuit board of claim 13, wherein:
the tapered hole tapers from a diameter of 0.5 mm to a diameter of 0.4 mm.

15. The printed circuit board of claim 13, wherein:
the tapered hole tapers at an angle of 1 to 10 degrees.

* * * * *